United States Patent
Oh et al.

(10) Patent No.: US 12,321,611 B2
(45) Date of Patent: Jun. 3, 2025

(54) MEMORY DEVICE, MEMORY SYSTEM, AND METHOD OF OPERATING THE MEMORY SYSTEM

(71) Applicant: SAMSUNG ELECTRONICS CO., LTD., Suwon-si (KR)

(72) Inventors: Eun Chu Oh, Suwon-si (KR); Junyeong Seok, Suwon-si (KR); Younggul Song, Suwon-si (KR); Byungchul Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 276 days.

(21) Appl. No.: 18/053,850

(22) Filed: Nov. 9, 2022

(65) Prior Publication Data

US 2023/0141554 A1 May 11, 2023

(30) Foreign Application Priority Data

Nov. 10, 2021 (KR) .................. 10-2021-0154256
May 17, 2022 (KR) .................. 10-2022-0060427

(51) Int. Cl.
*G06F 3/06* (2006.01)
*G06F 11/10* (2006.01)

(52) U.S. Cl.
CPC .......... *G06F 3/0619* (2013.01); *G06F 3/0644* (2013.01); *G06F 3/0673* (2013.01); *G06F 11/1068* (2013.01)

(58) Field of Classification Search
CPC .... G06F 3/0619; G06F 3/0644; G06F 3/0673; G06F 11/1068; G11C 2211/5621; G11C 2211/5642; G11C 2211/5643; G11C 11/5628; G11C 16/3454; G11C 16/3463; G11C 16/26; G11C 16/3404
See application file for complete search history.

(56) References Cited

U.S. PATENT DOCUMENTS

| | | | |
|---|---|---|---|
| 7,672,162 | B2 | 3/2010 | Hwang |
| 8,861,269 | B2 | 10/2014 | Chen et al. |
| 8,867,273 | B2 | 10/2014 | Izumi |
| 9,164,889 | B2 | 10/2015 | Kim et al. |
| 9,319,073 | B2 | 4/2016 | Alhussien et al. |
| 9,336,866 | B2 | 5/2016 | Kwak et al. |
| 9,417,960 | B2 | 8/2016 | Cai et al. |
| 10,811,109 | B2 | 10/2020 | Baraskar et al. |
| 10,937,512 | B2 | 3/2021 | Papandreou et al. |

(Continued)

FOREIGN PATENT DOCUMENTS

KR     10-0769802     10/2007

*Primary Examiner* — Thien Nguyen
(74) *Attorney, Agent, or Firm* — MORGAN, LEWIS & BOCKIUS LLP

(57) ABSTRACT

A method of operating a memory system includes programming, in a memory device, K logical pages stored in a page buffer circuit into a memory cell array, reading, from the memory device, the K logical pages programmed into the memory cell array into the page buffer circuit after a first delay time elapses, transmitting, in a memory controller, N–K logical pages to the memory device, and programming, in the memory device, N logical pages into the memory cell array based on the read K logical pages and the N–K logical pages, wherein K is a positive integer and N is a positive integer greater than K.

20 Claims, 16 Drawing Sheets

(56) References Cited

U.S. PATENT DOCUMENTS

| | | | |
|---|---|---|---|
| 2010/0106893 A1* | 4/2010 | Fasoli | G11C 16/102 |
| | | | 711/E12.078 |
| 2016/0141037 A1 | 5/2016 | Kim | |
| 2016/0372184 A1* | 12/2016 | Shalvi | G06F 11/1008 |
| 2020/0278906 A1* | 9/2020 | Bains | G06F 11/1052 |
| 2020/0295788 A1* | 9/2020 | Hirano | H03M 13/6566 |
| 2021/0082497 A1 | 3/2021 | Hara et al. | |
| 2022/0318090 A1* | 10/2022 | Wang | G06F 11/1076 |

\* cited by examiner

FIG. 7

|  | E2 | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| PAGE 1 | 1 | 1 | 0 | 0 | 0 | 0 | 0 | 0 | 0 | 0 | 1 | 1 | 1 | 1 | 1 | 1 |
| PAGE 2 | 1 | 1 | 1 | 1 | 0 | 0 | 0 | 0 | 1 | 1 | 1 | 1 | 0 | 0 | 0 | 0 |
| PAGE 3 | 1 | 1 | 1 | 1 | 1 | 1 | 0 | 0 | 0 | 0 | 0 | 0 | 0 | 0 | 1 | 1 |
| PAGE 4 | 1 | 0 | 0 | 1 | 1 | 0 | 0 | 1 | 1 | 0 | 0 | 1 | 1 | 0 | 0 | 1 |

FIG. 8

| WL | PGM TYPE | PAGE ADDRESS | | | | |
|---|---|---|---|---|---|---|
| | | SSL1 | SSL2 | SSL3 | SSL4 | |
| 1 | 1st PGM | 0 | 1 | 2 | 3 | → ① |
| | 2nd PGM | 8 | 9 | 10 | 11 | → ③ |
| 2 | 1st PGM | 4 | 5 | 6 | 7 | → ② |
| | 2nd PGM | 16 | 17 | 18 | 19 | → ⑤ |
| 3 | 1st PGM | 12 | 13 | 14 | 15 | → ④ |
| | 2nd PGM | 24 | 25 | 26 | 27 | → ⑦ |
| 4 | 1st PGM | 20 | 21 | 22 | 23 | → ⑥ |
| | 2nd PGM | 32 | 33 | 34 | 35 | → ⑧ |

A (pointing to 0, 8)
B (pointing to 15, 27)

MEMORY DEVICE, MEMORY SYSTEM, AND METHOD OF OPERATING THE MEMORY SYSTEM

CROSS-REFERENCE TO RELATED APPLICATIONS

This U.S. non-provisional patent application claims priority under 35 U.S.C. § 119 to Korean Patent Application Nos. 10-2021-0154256, filed on Nov. 10, 2021, and 10-2022-0060427, filed on May 17, 2022, in the Korean Intellectual Property Office, the disclosures of which are incorporated by reference in their entirety herein.

1. TECHNICAL FIELD

The inventive concept relates to a memory system, and more particularly, to a memory system that performs a multi-step program operation.

2. DISCUSSION OF RELATED ART

Semiconductor memory devices may be classified into volatile semiconductor memory devices and non-volatile semiconductor memory devices. Non-volatile semiconductor memory devices retain data even when power is no longer supplied. Data stored in non-volatile semiconductor memory devices may be permanent or reprogrammable. Non-volatile semiconductor memory devices are used for storage of user data and storage of programs and microcode in a wide range of applications, such as computers, avionics, telecommunications, and consumer electronics.

A multi-step program operation may be performed to program data to memory cells. The multi-step program operation performs a plurality of program operations to narrow the distribution of threshold voltages corresponding to data values to be stored. That is, the multi-step program operation includes a coarse program operation that performs a multi-bit program operation that roughly forms a threshold voltage distribution, and a fine program operation that precisely collects the threshold voltage distribution formed by the coarse program operation. However, it may be difficult to read data without errors when only the coarse program operation is performed.

2020 SUMMARY

At least one embodiment of the inventive concept provides a memory system that processes a read request even when only a first program operation is performed, and a method of operating the memory system.

Furthermore, at least one embodiment of the inventive concept provides a memory system that provides a program speed that is faster than a coarse-fine program operation, and a method of operating the memory system.

According to an embodiment of the inventive concept, there is provided a method of operating a memory system including a memory device and a memory controller. The method includes programming, in the memory device, K logical pages stored in a page buffer circuit into a memory cell array, reading, from the memory device, the K logical pages programmed into the memory cell array into the page buffer circuit after a first delay time elapses, transmitting, in the memory controller, N−K logical pages to the memory device, and programming, in the memory device, N logical pages into the memory cell array based on the read K logical pages and the N−K logical pages, where K is a positive integer and N is a positive integer greater than K.

According to an embodiment of the inventive concept, there is provided a memory system including a memory device including a memory cell array, a page buffer circuit, and an error detector, and a memory controller configured to provide, to the memory device, a command instructing performance of a program operation on N bit data, K bit data, and N−K bit data, where K is a positive integer and N is a positive integer greater than K. The memory device is configured to perform a first program operation on the K bit data in response to the command, read the K bit data from the memory cell array into the page buffer circuit after a first delay time elapses, provide the read K bit data to the memory controller based on an error in the read K bit data, receive corrected K bit data from the memory controller and store the corrected K bit data in the page buffer circuit, and perform a second program operation on the N bit data, based on the K bit data stored in the page buffer circuit and the N−K bit data, where K is a positive integer and N is a positive integer greater than K.

According to an embodiment of the inventive concept, there is provided a memory device including a memory cell array including a plurality of memory cells connected to a plurality of bit lines and a plurality of word lines, a page buffer circuit configured to temporarily store data to be stored in the memory cell array or data read from the memory cell array, an error detector configured to detect an error in data stored in the page buffer circuit, and a control logic circuit configured to, in response to a program command for N logical pages, perform a first program operation on the memory cell array based on K logical pages received from a memory controller and perform a second program operation on the memory cell array based on K logical pages, read from the memory cell array after a delay time elapses and error-corrected by the error detector, and N−K logical pages received from the memory controller, where K is a positive integer and N is a positive integer greater than K.

BRIEF DESCRIPTION OF THE DRAWINGS

Embodiments will be more clearly understood from the following detailed description taken in conjunction with the accompanying drawings in which:

FIG. 7 is a diagram illustrating a logical page corresponding to a program state according to an embodiment;

FIG. 8 is a diagram illustrating a multi-step program operation by address scrambling;

DETAILED DESCRIPTION OF THE EMBODIMENTS

Hereinafter, various embodiments will be described with reference to the accompanying drawings.

Figure 1:
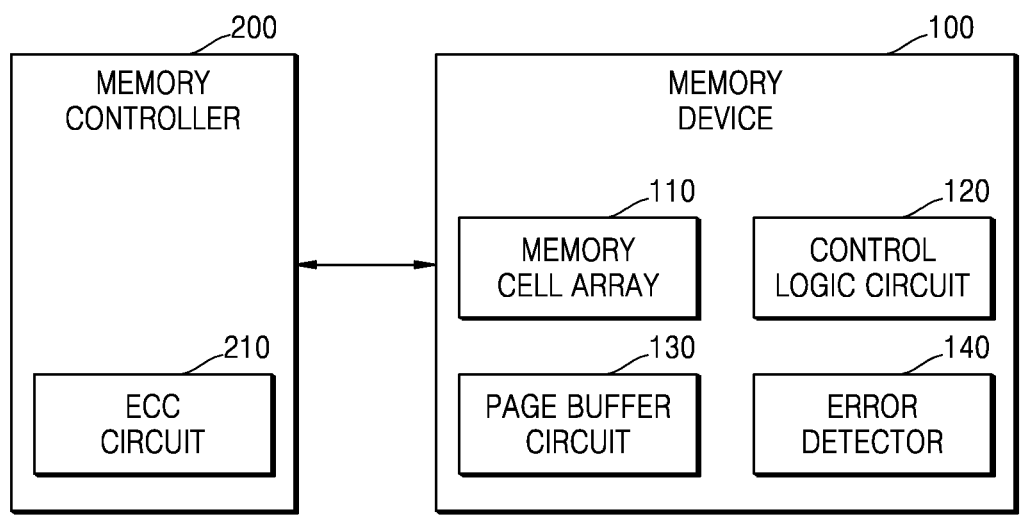
FIG. 1 is a diagram illustrating a memory system according to an embodiment.

FIG. 1 is a diagram illustrating a memory system 10 according to an embodiment.

Referring to FIG. 1, the memory system 10 may include a memory device 100 and a memory controller 200.

The memory device 100 may include a memory cell array 110, a control logic circuit 120, a page buffer circuit 130, and an error detector 140 (e.g., a logic circuit).

The memory cell array 110 includes word lines, bit lines, and memory cells each connected to each of the word lines and each of the bit lines. The memory cells may store data of at least one bit. A memory cell storing 1 bit may be referred to as a single level cell (SLC), a memory cell storing 2 bits may be referred to as a multi level cell (MLC), a memory cell storing 3 bits may be referred to as a triple level cell (TLC), and a memory cell storing 4 bits may be referred to as a quad level cell (QLC). The memory cells may be implemented as a non-volatile memory that stores data regardless of whether power is supplied thereto or a volatile memory that stores data while power is supplied thereto. A method of physically fuse-cutting using a laser or a method of electrically programming may be used to store data. For example, a memory implemented by memory cells may be dynamic random access memory (DRAM), static random access memory (SRAM), electrically erasable programmable read-only memory (EEPROM), flash memory, magnetic RAM (MRAM), conductive bridging RAM (CBRAM), ferroelectric RAM (FeRAM), phase change RAM (PRAM), or resistive RAM (RRAM or ReRAM). In this case, the memory cell array 110 may be implemented in two dimensions or three dimensions. Memory cells connected to one word line may be referred to as a physical page, and data stored in the physical page may be referred to as a logical page. Because each memory cell may store a plurality of bits, a plurality of logical pages may be stored in one physical page. For example, when only one logical page is programmed into a physical page, the memory cell included in the physical page may be an SLC, and when only two logical pages are programmed into a physical page, the memory cell included in the physical page may be an MLC.

The page buffer circuit 130 may store data to be programmed into the memory cell array 110 or data read from the memory cell array 110. The page buffer circuit 130 may include a plurality of page buffers respectively connected to a plurality of bit lines. Each of the plurality of page buffers may include a plurality of latches, and the plurality of latches may store data to be programmed into the memory cell array 110.

The control logic circuit 120 may control all operations of the memory device 100. According to an embodiment, the control logic circuit 120 performs a multi-step program operation. Hereinafter, a two-step program operation is mainly described, but a three-step or more program operation may be similarly performed. Also, hereinafter, a QLC program (or QLC programming operation), in which four logical pages are programmed into the memory cell array 110 through a two-step program operation, is described, but embodiments of the inventive concept are not limited thereto and may include an operation in which two, three, or five or more logical pages are programmed into the memory cell array 110.

The control logic circuit 120 may perform a two-step program operation to store four logical pages in the memory cell array 110. For example, during a first program operation, the control logic circuit 120 may perform a TLC program operation on three logical pages. The first program operation may be a fine program operation. During a second program operation, the control logic circuit 120 may perform a QLC program operation on four logical pages. The second program operation may be a fine program operation. Also, during the second program operation, the control logic circuit 120 may read, from the memory cell array 110, three logical pages programmed by the first program operation. Furthermore, the control logic circuit 120 may program four logical pages into the memory cell array 110 based on three logical pages read into the page buffer circuit 130 and one logical page received from the memory controller 200.

According to an embodiment, because three logical pages are obtained from the memory cell array 110 during the second program operation, a separate buffer memory to store the three logical pages may not be required. Accordingly, the size of a write buffer in the memory controller 200 or the memory device 100 may be reduced.

Furthermore, because only three logical pages are programmed during the first program operation, a faster program speed may be provided compared to a coarse-fine program method in which four logical pages are programmed in each of the first program operation and the second program operation.

Also, in the first program operation, because a fine program operation for three logical pages is performed, a read request for three logical pages may be processed even when only the first program operation has completed. When the first program operation is a coarse program operation, a distribution width of a threshold voltage distribution may be wide, and the number of errors in read data may increase due to overlap between distributions. Accordingly, a read request may not be processed. According to an embodiment, there is no need to wait until the second program operation has completed to process a read request, and thus, read performance may be improved.

The error detector 140 may detect an error in data stored in the page buffer circuit 130. For example, the error detector 140 may include an error correction code (ECC) circuit, a cyclic redundancy check (CRC) circuit, or a checksum circuit.

In an embodiment, three logical pages are read from the memory cell array 110 to perform a second program operation. However, there may be an error in the three read logical pages. Accordingly, the error detector 140 may detect errors in one or more of the three logical pages and may correct the errors, thereby increasing the reliability of the two-step program operation. When the number of detected errors is greater than a reference number, the read three logical pages may be transferred to the memory controller 200.

The memory controller 200 may control the operation of the memory device 100 by providing a command, data, or an address to the memory device 100. The memory controller 200 according to an embodiment controls the memory device 100 to perform a two-step program operation on four logical pages. Specifically, the memory controller 200 may provide three logical pages to the memory device 100, and may provide the remaining one logical page to the memory device 100 after a delay time elapses.

When receiving three logical pages from the memory device 100, the memory controller 200 may perform error correction on the three logical pages to generate three error-corrected logical pages and transmit the three error-corrected logical pages to the memory device 100.

According to an embodiment, because the memory device 100 includes the error detector 140, when the number of errors in the three logical pages read from the memory cell array 110 is less than or equal to a reference number, the error detector 140 may correct the errors. Accordingly, the amount of data transmitted between the memory controller 200 and the memory device 100 for error correction may be reduced.

Figure 2A:
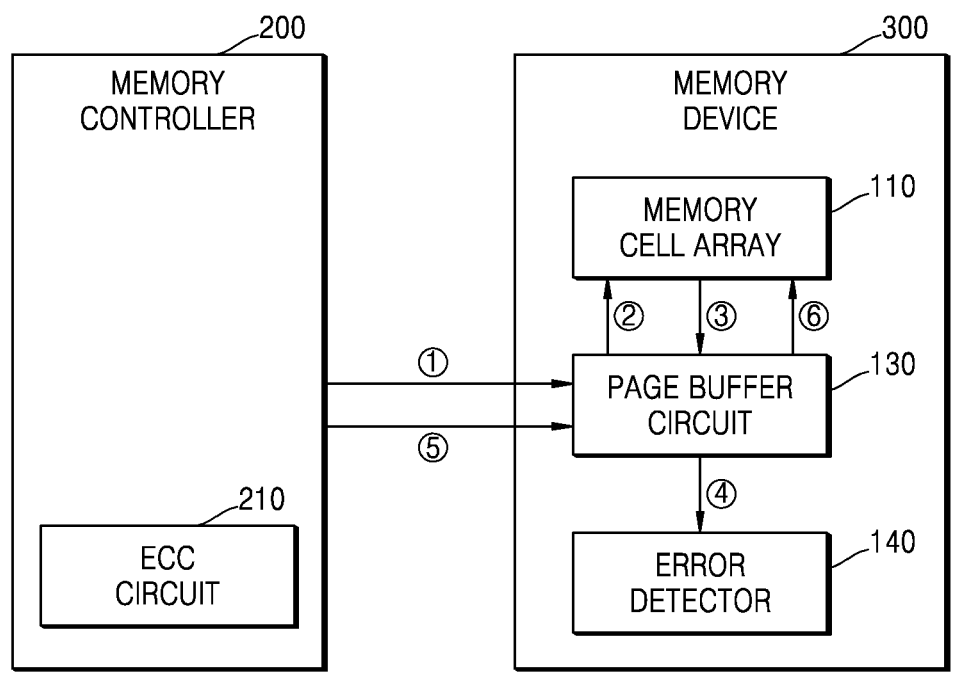
FIGS. 2A and 2B are diagrams illustrating a two-step program operation according to an embodiment.
Figure 2B:
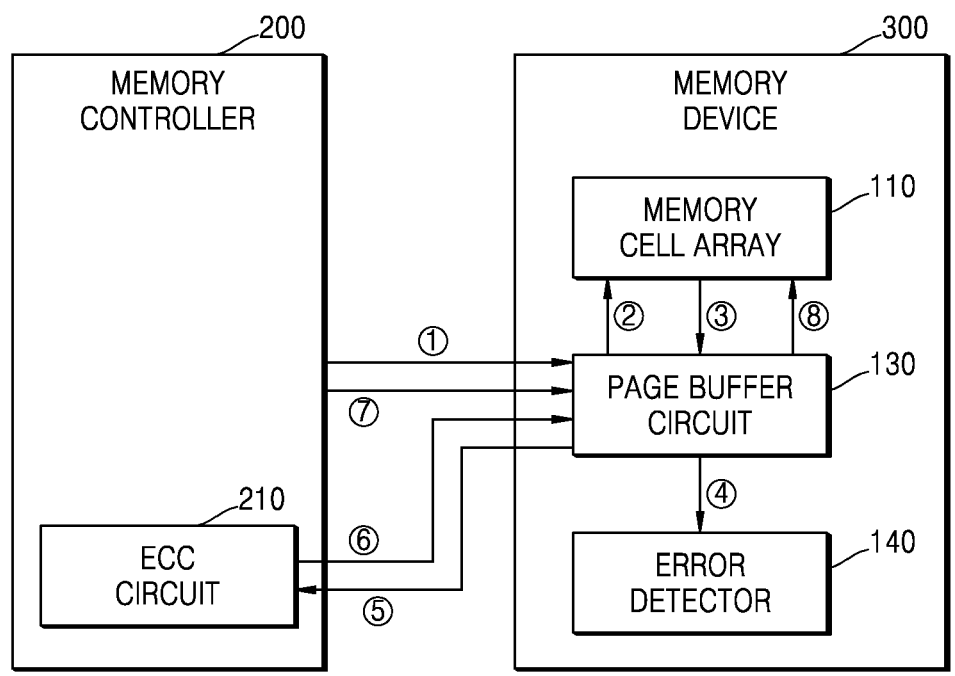

FIGS. 2A and 2B are diagrams illustrating a two-step program operation according to an embodiment. Specifically, FIG. 2A illustrates an embodiment in which an error detector 140 corrects error bits (or bit errors) in three logical pages read from a memory cell array 110, and FIG. 2B illustrates an embodiment in which the error detector 140 does not correct error bits in three logical pages read from the memory cell array 110.

Referring to FIG. 2A, a memory controller 200 transmits three logical pages to a memory device 300 for a first program operation, and the three logical pages may be stored in a page buffer circuit 130 (Operation ①). For example, it may be the intent of the memory controller 200 to program four or more logical pages even though it only initially transmits three logical pages to the memory device 300.

The three logical pages stored in the page buffer circuit 130 are programmed into the memory cell array 110 by the first program operation under control by a control logic circuit (i.e., the control logic circuit 120 in FIG. 1) (Operation ②). The first program operation may be a fine program operation. In an embodiment, the first program operation is a multi-step program operation including a coarse program operation and a fine program operation. As a result of the first program operation, a threshold voltage distribution formed by the threshold voltages of memory cells into which the three logical pages are programmed may have a narrower distribution width than a threshold voltage distribution cause by performance of only a coarse program for the three logical pages.

The three logical pages stored in the memory cell array 110 are read into the page buffer circuit 130 (Operation ③). In an embodiment, when a first delay time elapses after three logical pages are programmed into the memory cell array 110, the three logical pages are read from the memory cell array 110 to the page buffer circuit 130. For example, a delay may be present between Operation ② and Operation ③.

The error detector 140 may detect a number of errors in the three read logical pages (Operation ④). For example, the error detector 140 may perform an operation to determine whether errors are present in the read logical pages and a count of these errors. When the number of detected errors is less than or equal to a reference number, the error detector 140 may correct the errors to generate three corrected logical pages. In an embodiment, the three read logical pages stored in the page buffer circuit 130 are overwritten with the three corrected logical pages.

The memory controller 200 transmits the remaining one logical page to the memory device 300 for a second program operation, and the one logical page may be stored in the page buffer circuit 130 (Operation ⑤). That is, three logical pages read from the memory cell array 110 and one logical page received from the memory controller 200 may be stored in the page buffer circuit 130. In an embodiment, the remaining one logical page is transferred to the memory device 300 when a second delay time elapses after the three logical pages are transferred to the memory device 300. For example, the three logical pages may be transferred together to the memory device 300, the second delay time elapses, and then the remaining logical page is transferred to the memory device 300. In an embodiment, Operation ⑤ occurs after Operations ①, ②, and ③ complete or after Operations ①, ②, ③, and ④ complete. For example, when the original intent of the memory controller 200 was to program four logical pages, there is only remaining logical page to transfer. However, had the memory controller 200 intended to program five logical pages, then Operation ⑤ would have causes the memory controller 200 to transfer a remaining two logical pages to the memory device.

The four logical pages stored in the page buffer circuit 130 are programmed into the memory cell array 110 by the second program operation under control by the control logic circuit 120 (Operation ⑥). The second program operation may be a fine program operation. In an embodiment, the second program operation is a multi-step program operation including a coarse program operation and a fine program operation. As a result of the second program operation, a threshold voltage distribution formed by the threshold voltages of memory cells into which four logical pages are programmed may have a narrower distribution width than a threshold voltage distribution by only a coarse program for the four logical pages.

According to an embodiment, because the memory controller 200 does not need to store three logical pages after the first program operation, a QLC program operation may be possible even when the capacity of a write buffer in the memory controller 200 is small.

Referring to FIG. 2B, because Operations ①, ②, and ③ have been described with reference to FIG. 2A, descriptions thereof may be omitted.

In FIG. 2B, the error detector 140 detects the number of errors in the three read logical pages (Operation ④). In FIG. 2B, when the detected number of errors exceeds the reference number, the three logical pages stored in the page buffer circuit 130 are transferred to the memory controller 200 (Operation ⑤).

In FIG. 2B, the ECC circuit 210 included in the memory controller 200 performs error correction on the three logical pages to generate three error-corrected pages and transmits the three error-corrected logical pages to the memory device 300 (Operation ⑥).

In FIG. 2B, the memory controller 200 transmits the remaining one logical page to the memory device 300 for the second program operation, and the one logical page may be stored in the page buffer circuit 130 (Operation ⑦). That is, three logical pages error-corrected by the ECC circuit 210 and one logical page received from the memory controller 200 may be stored in the page buffer circuit 130. In an embodiment, the remaining one logical page is transferred to the memory device 300 when a second delay time elapses after the three logical pages are transferred to the memory device 300. For example, the memory controller 200 may transmit three error corrected logical pages to the memory device 300, delay for a delay time, and then transmit a single logical page to the memory device 300 after the delay time. The memory device 300 may store the received logical pages in the page buffer circuit 130.

The four logical pages stored in the page buffer circuit 130 may be programmed into the memory cell array 110 by the second program operation under control by the control logic circuit 120 (Operation ⑧).

Figure 3:
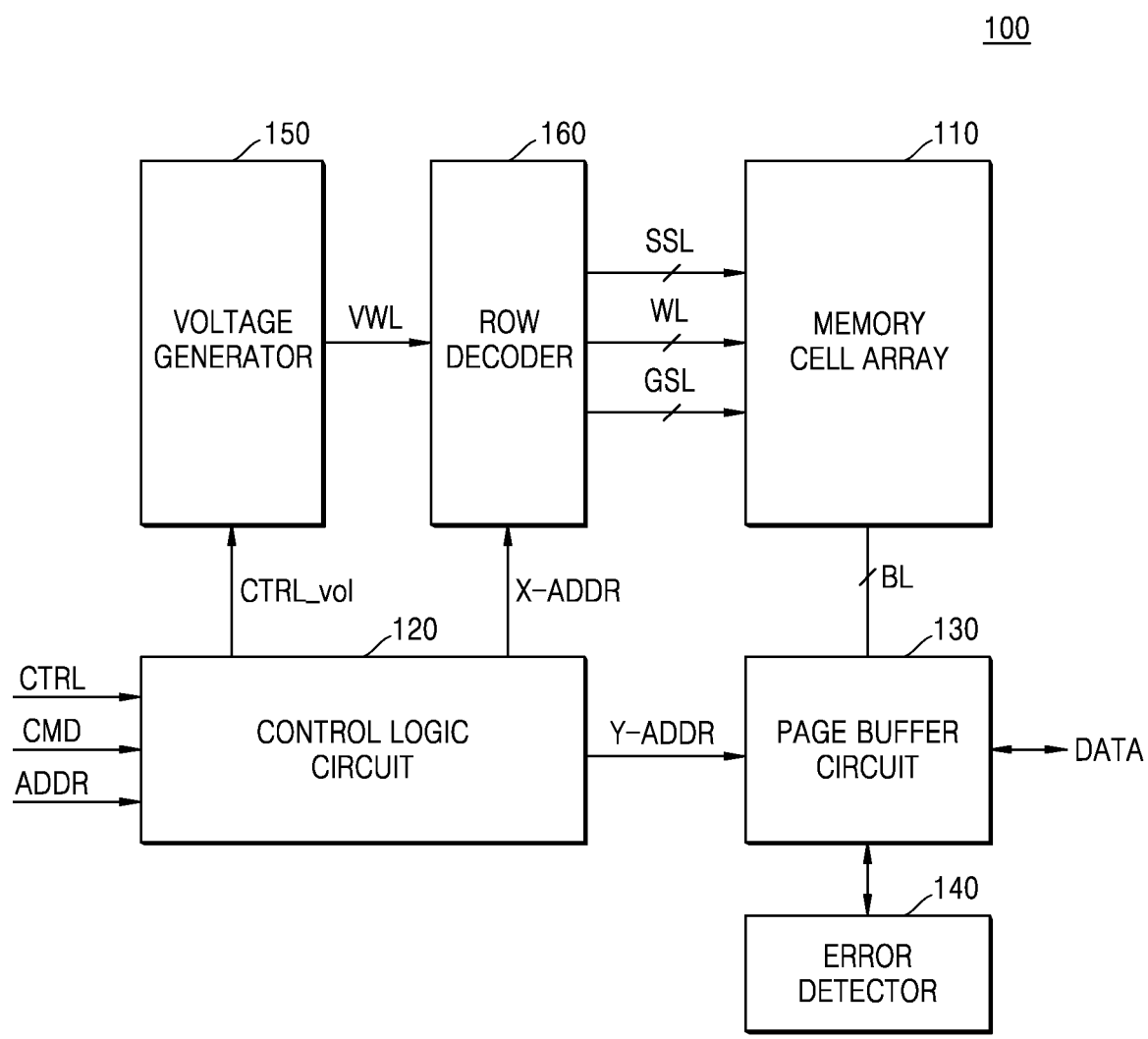
FIG. 3 is a block diagram of a memory device according to an embodiment.

FIG. 3 is a block diagram of a memory device 100 according to an embodiment.

Referring to FIG. 3, the memory device 100 may include a memory cell array 110, a control logic circuit 120, a page buffer circuit 130, an error detector 140 (e.g., a logic circuit), a voltage generator 150, and a row decoder 160 (e.g., a logic circuit). Although not shown in FIG. 3, the memory device 100 may further include a pre-decoder, a temperature sensor, a command decoder, a column decoder, an address decoder, and the like.

The memory cell array 110 may include a plurality of memory blocks, and each of the plurality of memory blocks may include a plurality of memory cells. The memory cell array 110 may be connected to the page buffer circuit 130 through bit lines BL, and may be connected to the row decoder 160 through word lines WL, string select lines SSL, and ground select lines GSL. Memory cells connected to one word line WL may be referred to as a physical page. Data programmed into one physical page may be referred to as a logical page. A plurality of logical pages may be programmed into one physical page.

In an embodiment, the memory cell array 110 may include a three-dimensional (3D) memory cell array, and the 3D memory cell array may include a plurality of NAND strings. Each of the NAND strings may include memory cells respectively connected to word lines stacked vertically on a substrate. U.S. Pat. Nos. 7,679,133, 8,553,466, 8,654,587, 8,559,235, and U.S. Patent Application Publication No. 2011/0233648 are incorporated by reference in their entirety herein. In an embodiment, the memory cell array 110 may include a two-dimensional (2D) memory cell array, and the 2D memory cell array may include a plurality of NAND strings arranged in row and column directions.

The control logic circuit 120 may generally control various operations in the memory device 100. The control logic circuit 120 may output various control signals in response to a command CMD and/or an address ADDR. For example, the control logic circuit 120 may output a voltage control signal CTRL_vol, a row address X-ADDR, and a column address Y-ADDR.

The page buffer circuit 130 may include a plurality of page buffers, and the plurality of page buffers may be respectively connected to memory cells through a plurality of bit lines BL. The page buffer circuit 130 may select at least one bit line among the bit lines BL in response to the control of the control logic circuit 120. The page buffer circuit 130 may operate as a write driver or a sense amplifier according to an operation mode. For example, during a program operation, the page buffer circuit 130 may apply a bit line voltage corresponding to data to be programmed to a selected bit line. During a read operation, the page buffer circuit 130 may sense data stored in a memory cell by sensing the current or voltage of the selected bit line.

According to an embodiment, the page buffer circuit 130 may apply bit line voltages respectively corresponding to three logical pages during a first program operation. When a second delay time elapses after the first program operation has completed, the page buffer circuit 130 may detect three logical pages from the memory cell array 110. For example, the programmed three logical pages may be read from the memory cell array 110 into the page buffer circuit 130. The error detector 140 may detect errors in the three detected or read logical pages. The error detector 140 may compare the number of errors with a reference number and correct the errors when the number of errors is less than or equal to the reference number. When the number of errors is greater than the reference number, the three logical pages may be transferred to the memory controller 200. The page buffer circuit 130 may apply bit line voltages respectively corresponding to four logical pages during a second program operation. For example, the four logical pages may include three logical pages corrected by the memory controller 200 or the error detector 140, and an additional logical page sent by the memory controller 200.

The voltage generator 150 may generate various types of voltages for performing program, read, and erase operations based on the voltage control signal CTRL_vol. For example, the voltage generator 150 may generate a program voltage, a read voltage, a program verify voltage, an erase voltage, etc. as word line voltages VWL.

The row decoder 160 may select one of the plurality of word lines WL in response to the row address X-ADDR and may select one of the plurality of string select lines SSL. For example, during a program operation, the row decoder 160 may apply a program voltage and a program verify voltage to a selected word line, and during a read operation, the row decoder 160 may apply a read voltage to the selected word line.

The error detector 140 may detect an error in data stored in the page buffer circuit 130. For example, the error detector 140 may detect an error by comparing the number of error bits included in three logical pages stored in the page buffer circuit 130 with a reference number. When the number of error bits is less than or equal to the reference number, the error detector 140 may correct the error. When the number of error bits is greater than the reference number, the three logical pages stored in the page buffer circuit 130 may be transferred to the memory controller 200. The page buffer circuit 130 may receive three logical pages corrected by the memory controller 200.

Figure 4:
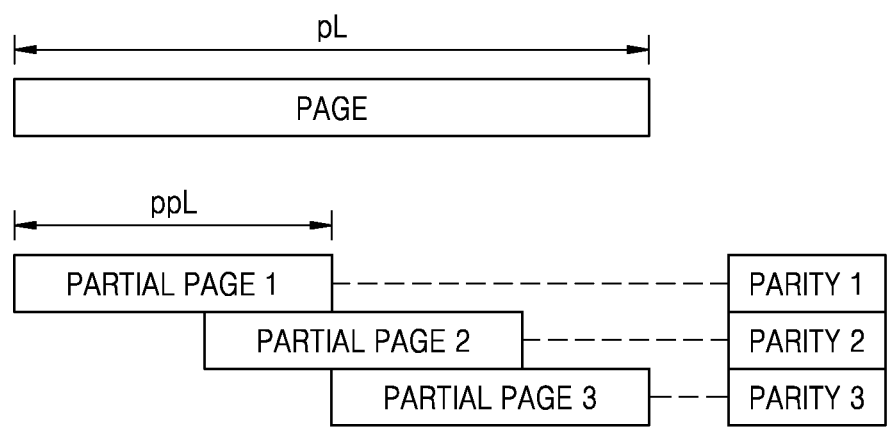
FIG. 4 is a diagram illustrating an error correction method according to an embodiment.

FIG. 4 is a diagram illustrating an error correction method according to an embodiment.

Referring to FIG. 4, a page may be classified into first to third partial pages, and the first to third partial pages may correspond to first to third parities, respectively. The first to third parities may be used to detect whether the first to third partial pages have errors, respectively. For example, the first parity may represent 1 when the number of 1's among bits constituting the first partial page is even, and may represent 0 when the number of 1's among the bits constituting the first partial page is odd. Accordingly, when there is one error in the first partial page, the number of 1's in the bits constituting the first partial page changes, and thus, whether the first partial page has an error may be detected through the first parity.

However, because it is difficult to detect a plurality of errors by using one parity, a plurality of errors in a page may be detected through parities of a plurality of partial pages. For example, the length of the page may be pL, and the length of each of the first to third partial pages may be ppL. Because an error included in the first to third partial pages may be detected by the first to third parities, a plurality of errors in the page may be detected. The number of partial pages and the length ppL of each of the partial pages may be adjusted to increase error detection. In an embodiment, each of the partial pages overlaps at least one of the other partial pages. For example, the first partial page may include a first part of the page and the second partial page may include the same first part. For example, the second partial page may include the first part and a second part of the page, and the third partial page may include the same second part.

Figure 5:
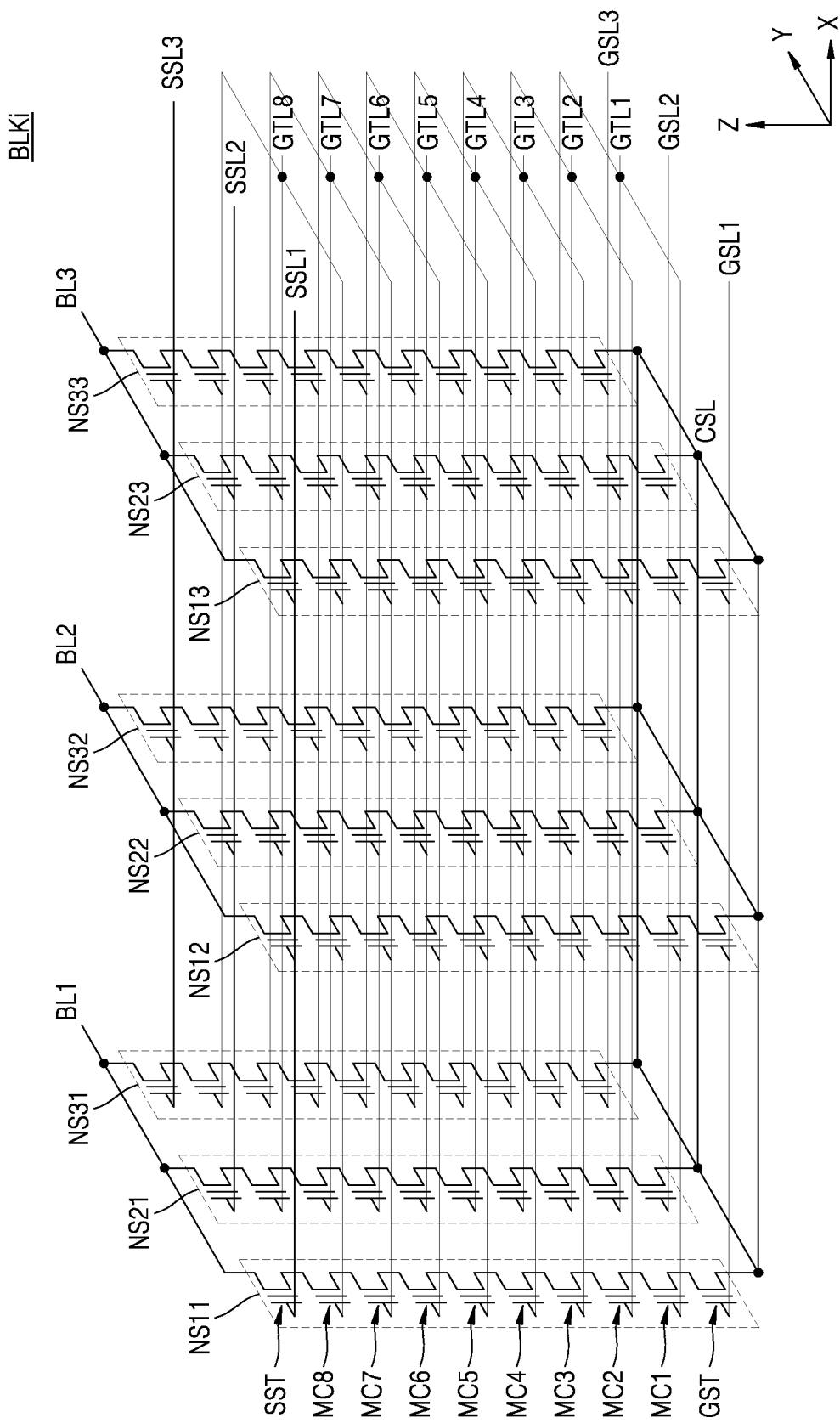
FIG. 5 is a diagram illustrating a three-dimensional (3D) vertical NAND structure according to an embodiment.

FIG. 5 is a diagram illustrating a 3D vertical NAND structure according to an embodiment. Each of the plurality of memory blocks of FIG. 3 may be represented by an equivalent circuit as shown in FIG. 5. A memory block BLKi illustrated in FIG. 5 represents a 3D memory block formed on a substrate in a 3D structure. For example, a plurality of memory NAND strings included in the memory block BLKi may be formed in a direction perpendicular to the substrate.

Referring to FIG. 5, the memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1, MC2, ..., and MC8, and a ground select transistor GST. In FIG. 5, each of the plurality of memory NAND strings NS11 to NS33 is illustrated as including eight memory cells MC1, MC2, ..., and MC8, but is not limited thereto.

The string select transistor SST may be connected to a string select line SSL1, SSL2, or SSL3 corresponding thereto. The plurality of memory cells MC1, MC2, ..., and MC8 may be respectively connected to gate lines GTL1, GTL2, ..., and GTL8 corresponding thereto. The gate lines GTL1, GTL2, ..., and GTL8 may correspond to word lines, and some of the gate lines GTL1, GTL2, ..., and GTL8 may correspond to dummy word lines. The ground select transistor GST may be connected to a ground select line GSL1, GSL2, or GSL3 corresponding thereto. The string select transistor SST may be connected to the bit line BL1, BL2, or BL3 corresponding thereto, and the ground select transistor GST may be connected to the common source line CSL.

Word lines (e.g., WL1) of the same height may be commonly connected, and the ground selection lines GSL1, GSL2, and GSL3 and the string select lines SSL1, SSL2, and SSL3 may be separated from each other. In FIG. 5, the memory block BLKi is illustrated as being connected to eight gate lines GTL1, GTL2, ..., and GTL8 and three bit lines BL1, BL2, BL3. However, the inventive concept is not necessarily limited thereto.

The 3D non-volatile memory device may be implemented as a charge trap flash (CTF). In this case, an initial verify shift (IVS), in which charges trapped in a programmed CTF are redistributed over time and lost, may occur. A multi-step program operation may be performed to overcome this distribution deterioration phenomenon. According to an embodiment, for a 4-bit program, a 3-bit fine program operation is performed during a first program operation and a 4-bit fine program operation is performed during a second program operation.

Figure 6:
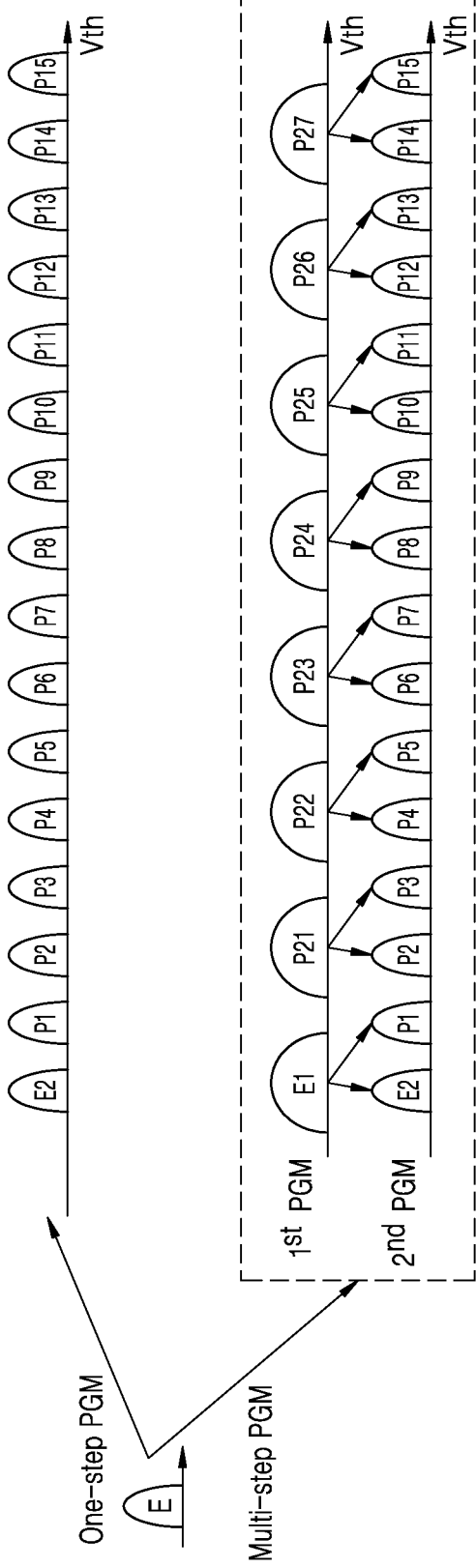
FIG. 6 is a diagram illustrating the distribution of a threshold voltage of a memory cell according to a program method.

FIG. 6 is a diagram illustrating the distribution of a threshold voltage of a memory cell according to a program method. In FIG. 6, it is assumed that a 4-bit program operation is performed on the memory cell for convenience of description. Accordingly, the memory cell is programmed with at least one of 16 threshold voltage distributions.

Referring to FIG. 6, the threshold voltage distribution of the memory cell may be programmed in at least one of an erase state E2 and program states P1 to P15 during a one-step program operation. The program states P1 to P15 are final states for storing 4-bit data.

Referring back to FIG. 6, in a multi-step program operation, a first program operation ($1^{st}$ PGM) is performed, and then, a second program operation ($2^{nd}$ PGM) is performed. Here, the first program operation may be a 3-bit program operation, and the second program operation may be a 4-bit program operation. Furthermore, both the first program operation and the second program operation may be fine-program operations.

During the first program operation, the threshold voltage distribution of the memory cell may be programmed in at least one of an erase state E1 and program states P21 to P27. During the second program operation, the threshold voltage distribution of the memory cell may be programmed in at least one of the erase state E2 and the program states P1 to P15. During the second program operation, the erase state E2 and the program state P1 may be formed based on the erase state E1 of the first program operation. The program states P2 and P3 may be formed based on the program state P21. The program states P4 and P5 may be formed based on the program state P22. The program states P6 and P7 may be formed based on the program state P23. The program states P8 and P9 may be formed based on the program state P24. The program states P10 and P11 may be formed based on the program state P25. The program states P12 and P13 may be formed based on the program state P26. The program states P14 and P15 may be formed based on the program state P27. In an embodiment, the threshold voltage distribution as a result of the first program operation has less states than the threshold voltage distribution as a result of the second program operation.

FIG. 7 is a diagram illustrating a logical page corresponding to a program state according to an embodiment.

Referring to FIG. 7, a memory cell may be programmed in an erase state E2 or one of program states P1 to P15. The memory cell may be a QLC that stores four bits, and the erase state E2 and the program states P1 to P15 may correspond to four logical pages.

Referring to FIG. 7, the erase state E2 and the program state P1 may be distinguished from each other by a fourth logical page. That is, in the erase state E2 and the program state P1, first to third logical page values may be respectively equal to 1, 1, and 1, but fourth logical page values may be different from each other. In other words, referring to both FIG. 6 and FIG. 7, the erase state E2 and the program state P1 may be formed based on the erase state E1 corresponding to three bits 1, 1, and 1. Similarly, the program states P2 to P15 may be distinguished from one another by neighboring program states and the fourth logical page.

FIG. 8 is a diagram illustrating a multi-step program operation performed using address scrambling. Here, a delay time between the first program operation ($1^{st}$ PGM) and the second program operation ($2^{nd}$ PGM) may be determined by address scrambling. According to the address scrambling, the first program operation and the second program operation of each of the plurality of word lines may be discontinuously performed.

Referring to FIG. 8, the horizontal axis of a table indicating the address scrambling indicates first to fourth string select lines SSL1 to SSL4, and the vertical axis of the table indicates first to fourth word lines WL1 to WL4. Points at which one string select line is related to one word line indicate addresses of memory cells. For example, a position A means the position of memory cells at a point at which the first string select line SSL1 is related to the first word line WL1, and a position B means the position of memory cells at a point at which the fourth string select line SSL4 is related to the third word line WL3. A coarse program operation and a fine program operation may be sequentially performed on memory cells located at respective addresses.

In FIG. 8, for convenience of description, it is assumed that first to eighth operations ①, ②, ③, ④, ⑤, ⑥, ⑦, and ⑧ are sequentially performed for the first to fourth word lines WL1 to WL4. That is, after a first program operation on the first word line WL1 is completed in the first operation ①, a first program operation on the second word line WL2 is completed in the second operation ②. Thereafter, in the third operation ③, a second program operation on the first word line WL1 is performed, and in the fourth operation ④, a first program operation on the third word line WL3 is performed. Also, in the fifth operation ⑤, a second program operation on the second word line WL2 is performed.

A delay time between the first program operation and the second program operation at the position A may be a time during which seven first program operations (1 to 7) are performed. A delay time between the first program operation and the second program operation at the position B may be a time during which seven second program operations (16 to 19 and 24 to 26) and four first program operations (20 to 23) are performed. That is, delay times may vary for each position of the memory cells.

Figure 9:
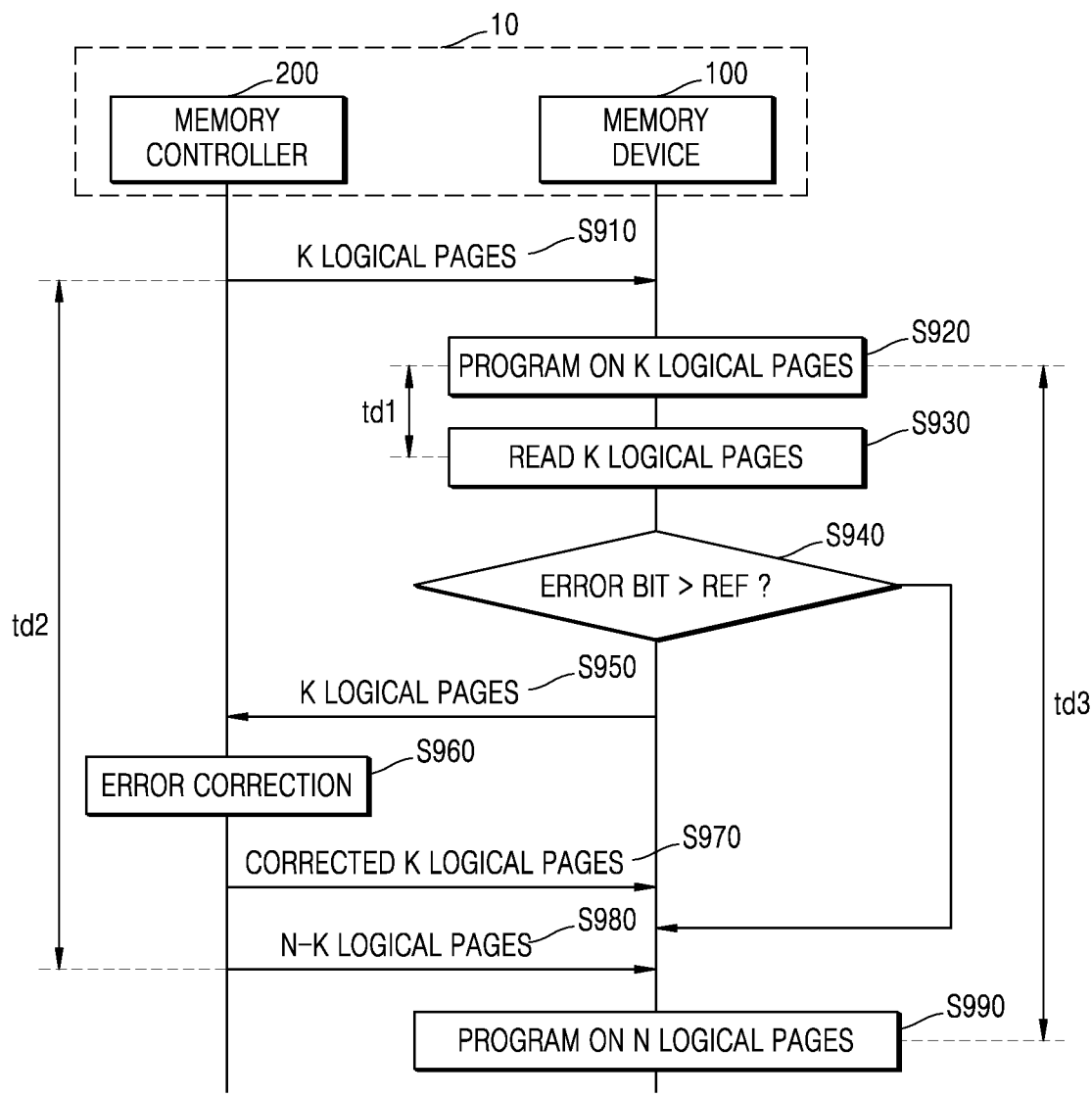
FIG. 9 is a view illustrating a method of operating a memory system, according to an embodiment.

FIG. 9 is a view illustrating a method of operating a memory system 10, according to an embodiment. Referring to FIG. 9, the method of operating the memory system 10 may include a plurality of operations (operations S910 to S990). In an embodiment, when the operations performed are described in units of bits, N logical pages, K logical pages and N–K logical pages may correspond to N bit data, K bit data and N–K bit data, respectively.

In operation S910, the memory controller 200 transmits K (K is a positive integer) logical pages to the memory device 100. The K logical pages may be stored in the page buffer circuit 130. The memory controller 200 may also transmit, to the memory device 100, a command instructing a program of N (N is a positive integer greater than K) logical pages. For example, even though the command instructs programming of N logical pages, the memory controller 200 may initially only transfer K logical pages to the memory device 100.

In operation S920, the memory device 100 programs the K logical pages stored in the page buffer circuit 130 into the memory cell array 110. A program operation for the K logical pages may be referred to as a first program operation. The first program operation may be performed as a fine program operation.

In operation S930, when a first delay time td1 elapses after the first program operation is completed, the memory device 100 reads the K logical pages programmed into the memory cell array 110.

In operation S940, the memory device 100 detects error bits in the K read logical pages and compares the number of error bits with a reference number. For example, the memory device 100 may detect the number of error bits in the K read logical pages based on parity bits corresponding to partial pages included in each of the K read logical pages. When the number of error bits is greater than the reference number, operation S950 is performed, and when the number of error bits is less than or equal to the reference number, operation S980 is performed.

In operation S950, the memory device 100 transmits the K read logical pages to the memory controller 200.

In operation S960, the memory controller 200 performs error correction on the K logical pages to generate K corrected logical pages. For example, the ECC circuit 210 may perform error correction on the K logical pages through an ECC operation.

In operation S970, the memory controller 200 transmits the K corrected logical pages to the memory device 100.

In operation S980, the memory controller 200 transmits N–K logical pages to the memory device 100. In an embodiments, operation S980 is performed when a second delay time td2 elapses after operation S910 is performed.

In operation S990, the memory device 100 performs a second program operation on the N logical pages, based on the K logical pages and the N–K logical pages. The second program operation may be a fine program operation.

Figure 10:
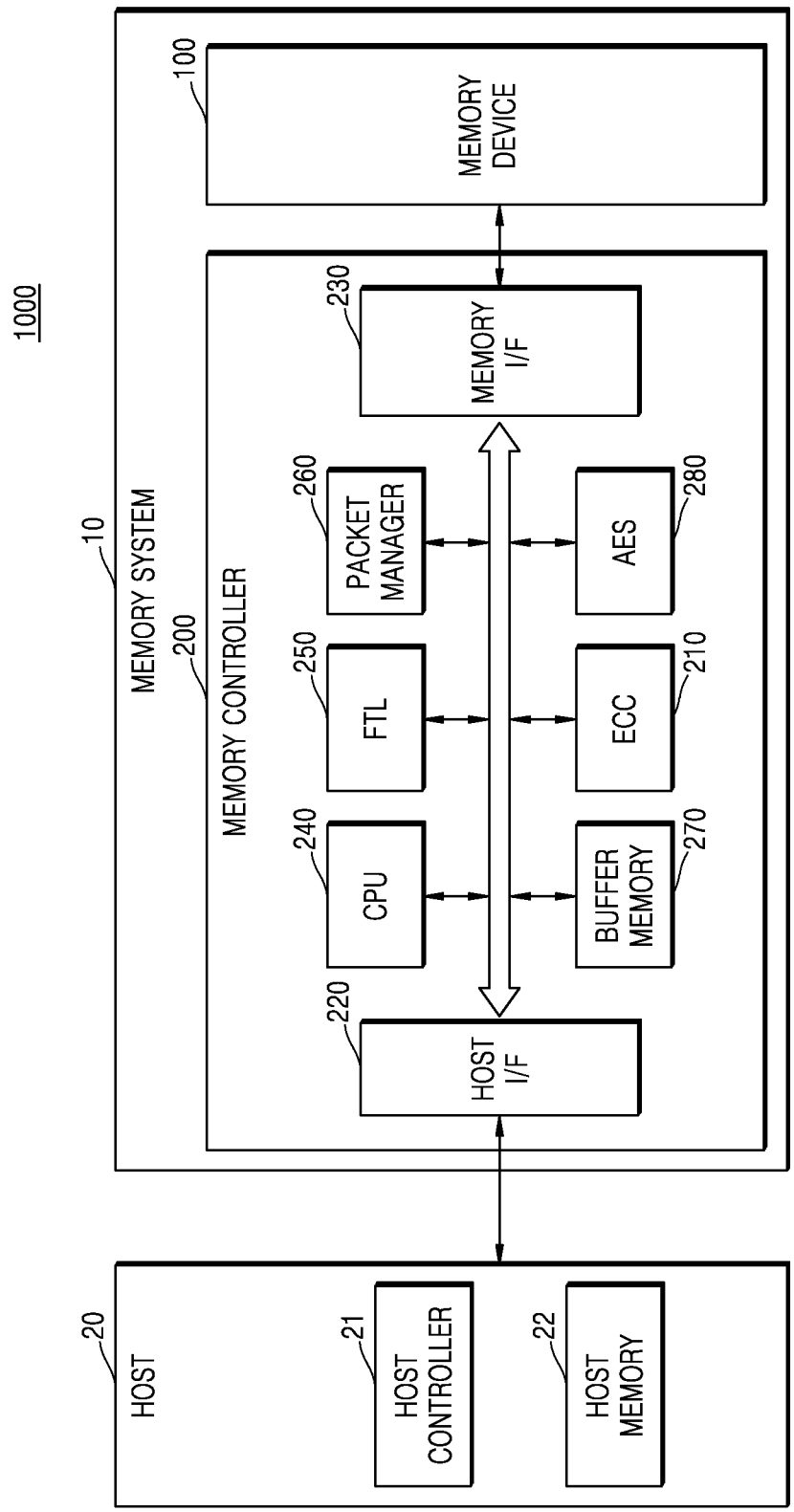
FIG. 10 is a block diagram of a host-memory system according to an embodiment.

FIG. 10 is a block diagram of a host-memory system 1000 according to an embodiment.

The host-memory system 1000 may include a host 20 and a memory system 10. Also, the memory system 10 may include a memory controller 200 and a memory device 100. Also, according to an embodiment, the host 20 may include a host controller 21 and a host memory 22. The host memory 22 may function as a buffer memory for temporarily storing data to be transmitted to the memory system 10 or data transmitted from the memory system 10.

The memory system 10 may include storage media for storing data according to a request from the host 20. As an example, the memory system 10 may include at least one of a solid state drive (SSD), an embedded memory, and a detachable external memory. When the memory system 10 is an SSD, the memory system 10 may be a device conforming to a non-volatile memory express (NVMe) standard. When the memory system 10 is an embedded memory or an external memory, the memory system 10 may be a device conforming to a universal flash storage (UFS) or an embedded multi-media card (eMMC) standard. The host 20 and the memory system 10 may each generate and transmit a packet according to an adopted standard protocol.

When the memory device 100 of the memory system 10 includes a flash memory, the flash memory may include a 2D NAND memory array or a 3D (or vertical) NAND (VNAND) memory array. As another example, the memory system 10 may include various other types of non-volatile memories. For example, the memory system 10 may include MRAM, spin-transfer torque MRAM, CBRAM, FeRAM, PRAM, RRAM, and/or other type of memory.

According to an embodiment, the host controller 21 and the host memory 22 may be implemented as separate semiconductor chips. Alternatively, in some embodiments, the host controller 21 and the host memory 22 may be integrated in the same semiconductor chip. As an example, the host controller 21 may be any one of a plurality of modules or devices included in an application processor, and the application processor may be implemented as a system on chip (SoC). In addition, the host memory 22 may be an embedded memory provided in the application processor or a non-volatile memory or a memory module disposed outside the application processor.

The host controller 21 may manage an operation of storing data (e.g., write data) of a buffer region of the host memory 22 in the memory device 100 or storing data (e.g., read data) of the memory device 100 in the buffer region.

The memory controller 200 may include a host interface 220, a memory interface 230, and a central processing unit (CPU) 240. In addition, the memory controller 200 may further include a flash translation layer (FTL) 250, a packet manager 260, a buffer memory 270, an ECC circuit 210, and an advanced encryption standard (AES) circuit 280. The memory controller 200 may further include a working memory (not shown) into which the FTL 250 is loaded, and the CPU 240 may execute the FTL 250 to control data write and read operations on the memory device 100.

The host interface 220 may transmit and receive packets to and from the host 20. A packet transmitted from the host 20 to the host interface 220 may include a command or data to be written to the memory device 100, and a packet transmitted from the host interface 220 to the host 20 may include a response to the command or data read from the memory device 100. The memory interface 230 may transmit, to the memory device 100, data to be written to the memory device 100 or receive data read from the memory device 100. The memory interface 230 may be implemented to comply with a standard protocol, such as Toggle or open NAND flash interface (ONFI).

The FTL 250 may perform various functions, such as address mapping, wear-leveling, and garbage collection. The address mapping operation may be an operation of converting a logical address received from the host 20 into a physical address used to actually store data in the memory device 100. The wear-leveling may be a technique for preventing excessive deterioration of a specific block by allowing blocks in the memory device 100 to be uniformly used. For example, the wear-leveling may be implemented using a firmware technique for balancing erase counts of physical blocks. The garbage collection may be a technique for securing usable capacity in the memory device 100 by copying valid data of an existing block to a new block and then erasing the existing block.

The packet manager 260 may generate a packet according to a protocol of an interface with the host 20 or parse various types of information from the packet received from the host 20.

The buffer memory 270 may temporarily store data to be written to or read from the memory device 100. The buffer memory 270 may be a component provided in the memory controller 200, but may be outside the memory controller 200. According to an embodiment, three logical pages are temporarily stored in the buffer memory 270 during a first program operation, and one logical page is temporarily stored in the buffer memory 270 during a second program operation. That is, among four logical pages for the second program operation, three logical pages are read from the memory cell array 110 in the memory device 100, and thus, only one logical page need be stored in the buffer memory 270. Accordingly, a QLC program operation may be performed using the buffer memory 270 having a small capacity. In some embodiments, when the three logical pages read from the memory cell array 110 include a greater number of error bits than a reference number, the three read logical pages may be transferred to the buffer memory 270. The ECC circuit 210 may perform error correction on the three logical pages stored in the buffer memory 270.

The ECC circuit 210 may perform an error detection and correction function on read data read from the memory device 100. More specifically, the ECC circuit 210 may generate parity bits for write data to be written into the memory device 100, and the generated parity bits may be stored in the memory device 100 together with the write data. When reading data from the memory device 100, the ECC circuit 210 may correct an error in the read data by using parity bits read from the memory device 100 together with the read data to generate error-corrected read data and output the error-corrected read data.

The AES circuit 280 may perform at least one of an encryption operation and a decryption operation on data input to the memory controller 200 using a symmetric-key algorithm.

Figure 11:
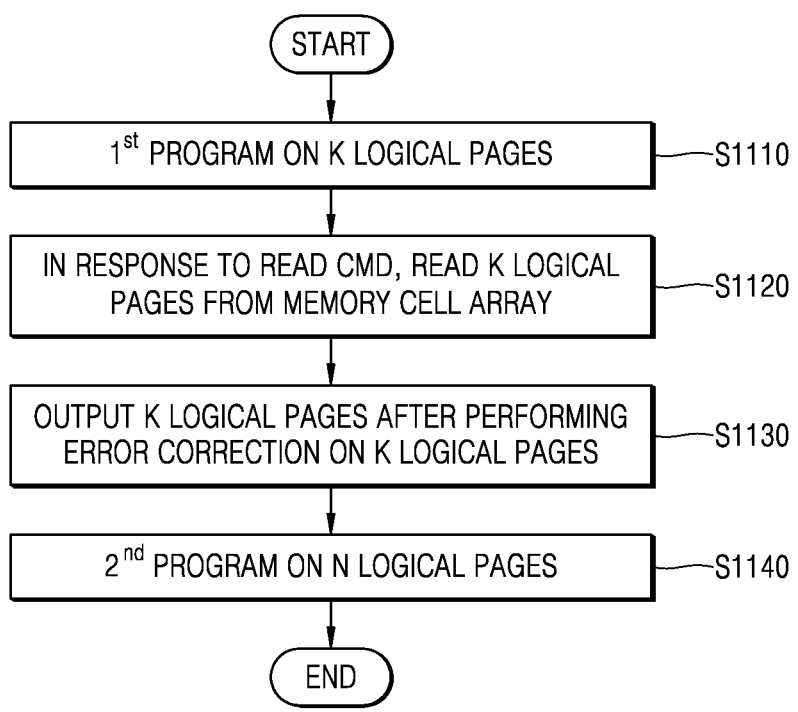
FIG. 11 is a flowchart illustrating a multi-step program operation method for programming N logical pages, according to an embodiment.

FIG. 11 is a flowchart illustrating a multi-step program operation method for programming N logical pages, according to an embodiment. The multi-step program operation method may include a plurality of operations S1110 to S1140.

In operation S1110, the memory device 100 performs a first program operation on K logical pages. For example, K may be a positive integer of 1 or greater. The first program operation may be a fine program operation.

In operation S1120, the memory device 100 reads the K programmed logical pages from the memory cell array 110 in response to a read command. Because the first program operation is a fine program operation, the reliability of the K read logical pages may be relatively high. According to an embodiment, the memory device 100 may receive the read command from the memory controller 200 before a first delay time td1 elapses.

In operation S1130, the memory device 100 performs error correction on the K read logical pages to generate K corrected logical pages and then outputs the K corrected logical pages to the memory controller 200.

In operation S1140, the memory device 100 receives N−K logical pages from the memory controller 200 and reads K logical pages from the memory cell array 110, thereby performing a second program operation on the N logical pages, where N is greater than K. For example, if N is 5 and K is 3, then the memory device 100 receives two logical pages from the memory controller 200. The second program operation may be a fine program operation. According to an embodiment, the second program operation is performed when a third delay time elapses after the first program operation is performed.

According to an embodiment, because a fine program for K logical pages is performed during the first program operation, the memory device 100 may process a read request for the K logical pages before completing the second program operation.

Figure 12:
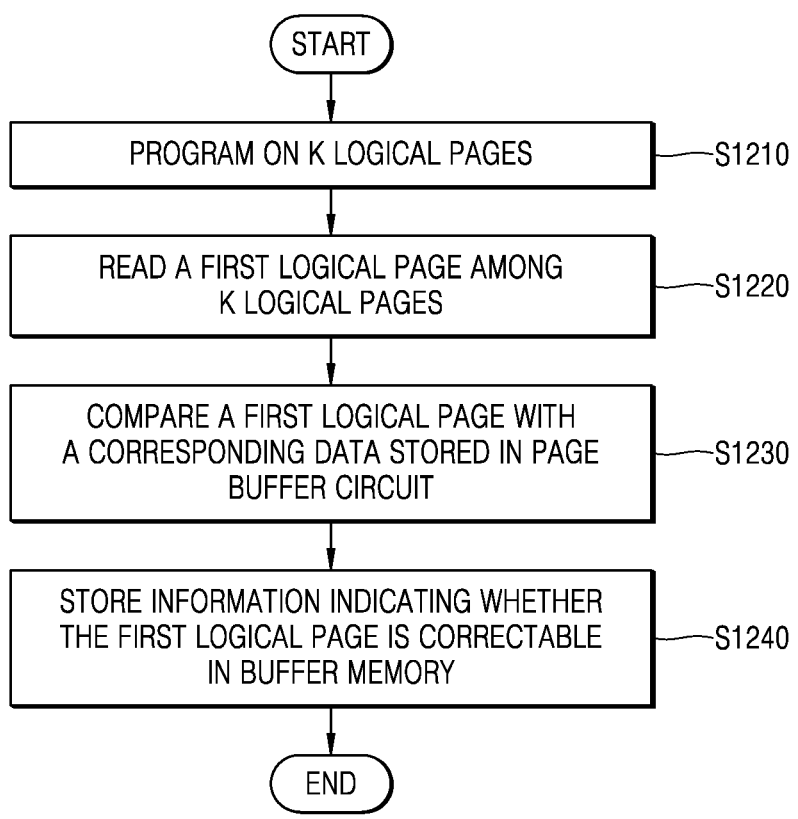
FIG. 12 is a flowchart illustrating a first program operation method of a memory device according to an embodiment.

FIG. 12 is a flowchart illustrating a first program operation method of a memory device according to an embodiment. Referring to FIG. 12, the first program operation method may include a plurality of operations S1210 to S1240.

In operation S1210, the memory device 100 performs a program operation on K logical pages. In an embodiment, the K logical pages are programmed in the memory cell array 110 using a fine programming method. The K logical pages may be received from the memory controller 200. The K logical pages may be stored in the page buffer circuit 130 included in the memory device 100. That is, the K logical pages stored in the page buffer circuit 130 may have higher reliability than data read from the memory cell array 110.

In operation S1220, the memory device 100 reads a first logical page among the K logical pages. In an embodiment, the memory device 100 may read a first logical page among the K logical pages from the memory cell array 110 before the first delay time td1 elapses. The first logical page may be a logical page in which an error is highly likely to occur among the K logical pages. For example, the first logical page may be a logical page for discriminating the highest program state from among the K logical pages. Referring to FIG. 6, when K is 3, the highest program state may be the program state P27. Referring to FIG. 7, the program state P27 is formed based on three logical page bits 1, 0, and 1 and is distinguished from the program state P26 through a third logical page Page 3, and thus, a first logical page may be the third logical page Page 3. The read first logical page may be stored in a latch that does not store the K logical pages from among latches included in the page buffer circuit 130. The embodiment is not limited thereto, and the memory device 100 may read some or all of the K logical pages.

In operation S1230, the memory device 100 may detect an error bit of the read first logical page by comparing the read first logical page with the first logical page stored in the page buffer circuit 130. However, embodiments of the inventive concept are not limited thereto, and the memory device 100 may detect error bits of the K logical pages by comparing some or all of the read K logical pages with some or all of the K logical pages stored in the page buffer circuit 130.

In operation S1240, the memory device 100 may store, in a buffer memory, information indicating whether error correction for the K logical pages is possible, based on a comparison result between the number of error bits and a reference number. For example, when the number of error bits is greater than the reference number, the information indicating that error correction for the K logical pages is not possible is stored in the buffer memory; when the number of error bits is less than or equal to the reference number, the information indicating that error correction for the K logical pages is possible is stored in the buffer memory. The buffer memory may be included in the memory device 100. The buffer memory may be implemented as a non-volatile memory, a volatile memory, or a register.

Figure 13:
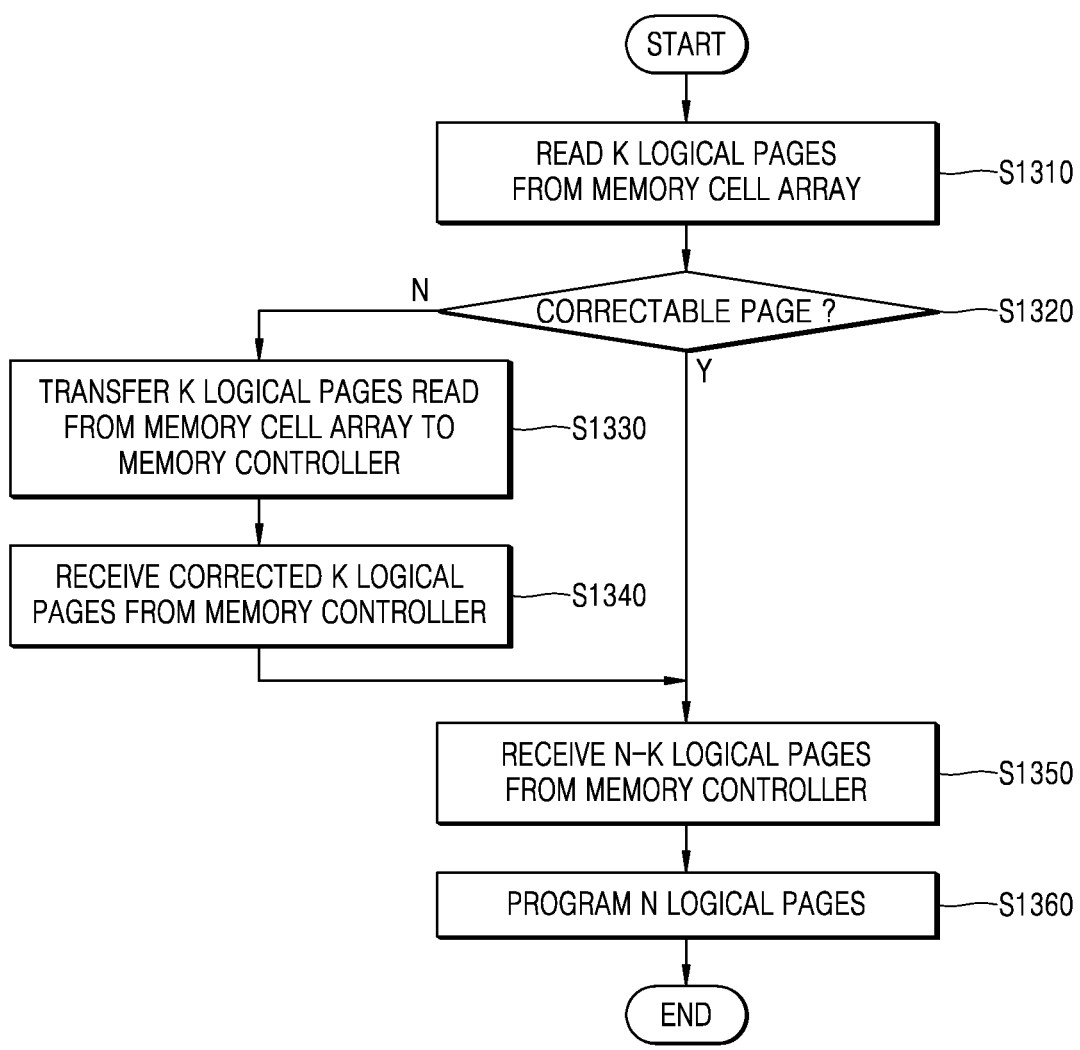
FIG. 13 is a flowchart illustrating a second program operation method of a memory device according to an embodiment.

FIG. 13 is a flowchart illustrating a second program operation method of a memory device according to an embodiment. Referring to FIG. 13, the second program operation method may include a plurality of operations S1310 to S1360.

In operation S1310, the memory device 100 reads K logical pages from the memory cell array 110. The read K logical pages may be stored in the page buffer circuit 130. In an embodiment, operation S1310 is performed when a first delay time elapses after the first program operation is completed.

In operation S1320, the memory device 100 determines whether the read K logical pages are correctable pages, based on information stored in the buffer memory. When the K logical pages are correctable pages, operation S1350 is performed, and when the K logical pages are non-correctable pages, operation S1330 is performed.

In operation S1330, the memory device 100 transmits the K logical pages read from the memory cell array 110 to the memory controller 200.

In operation S1340, the memory device 100 receives corrected K logical pages from the memory cell array 110. The corrected K logical pages may be stored in the page buffer circuit 130.

In operation S1350, the memory device 100 receives N–K logical pages from the memory controller 200. In an embodiment, operation S1350 is performed when a second delay time elapses after the memory device 100 receives K logical pages from the memory controller 200 in operation S1210 of FIG. 12.

In operation S1360, the memory device 100 performs a program operation on N logical pages, based on the N–K logical pages and the K logical pages. The program operation on the N logical pages may be a fine program operation. In an embodiment, operation S1360 is performed when a third delay time elapses after the memory device 100 performs a program operation on K logical pages in operation S1210 of FIG. 12.

Figure 14:
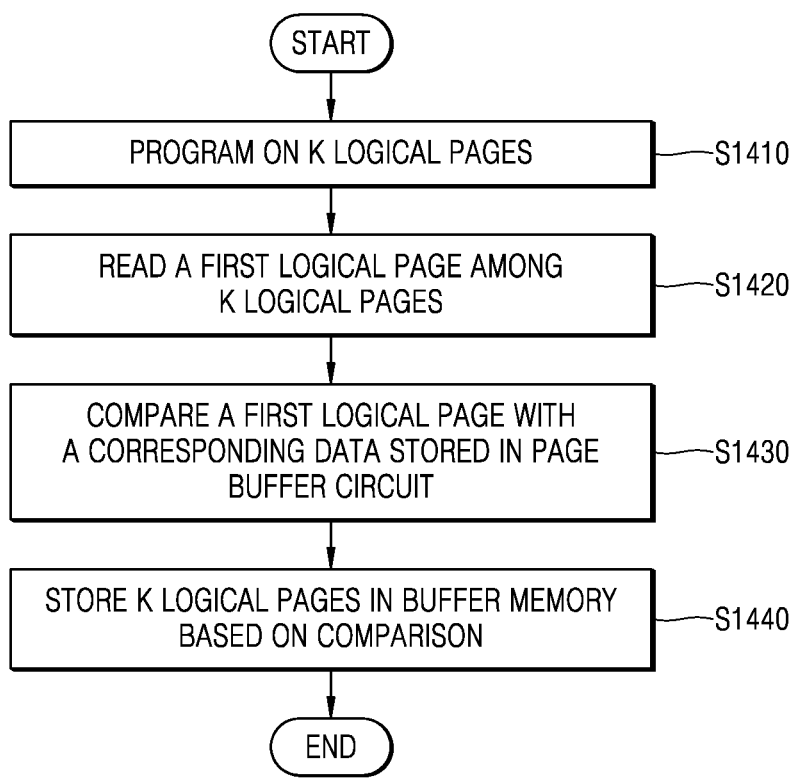
FIG. 14 is a flowchart illustrating a first program operation method of a memory device according to an embodiment.

FIG. 14 is a flowchart illustrating a first program operation method of a memory device according to an embodiment. Referring to FIG. 14, the first program operation method may include a plurality of operations S1410 to S1440. Operations S1410 to S1430 may correspond to operations S1210 and S1230 of FIG. 12, respectively.

In operation S1440, when the number of error bits is greater than a reference number, the memory device 100 stores K logical pages stored in the page buffer circuit 130 in a buffer memory. For example, when operation S1430 determines that the number of error bits is greater than a reference number, operation S1440 may be performed. The memory device 100 may store addresses of memory cells, into which the K logical pages are programmed, in the buffer memory. The buffer memory may be included in the memory device 100. The buffer memory may be implemented as a non-volatile memory, a volatile memory, or a register.

Figure 15:
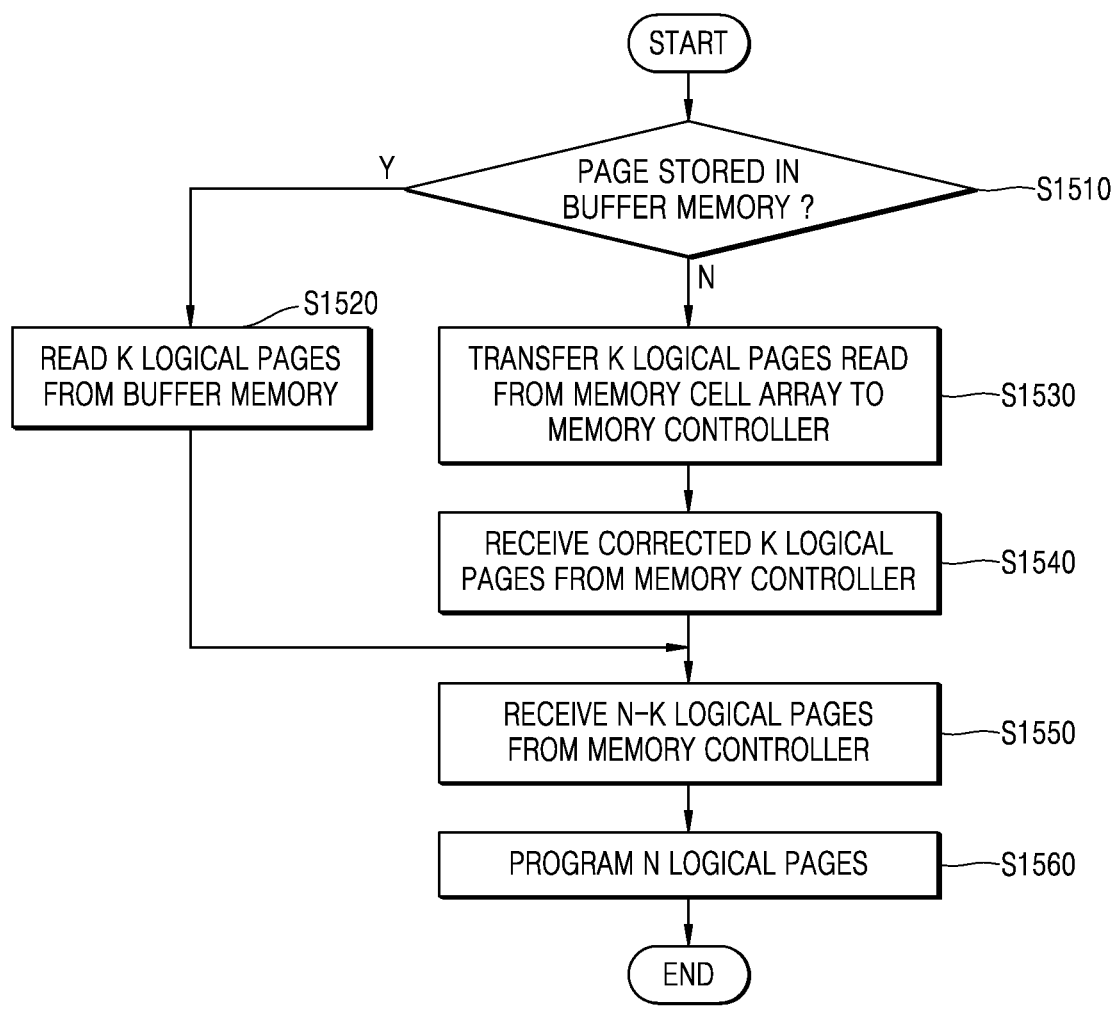
FIG. 15 is a flowchart illustrating a second program operation method of a memory device according to an embodiment.

FIG. 15 is a flowchart illustrating a second program operation method of a memory device according to an embodiment. Referring to FIG. 15, the second program operation method may include a plurality of operations S1510 to S1560.

In operation S1510, the memory device 100 determines whether K logical pages are stored in the buffer memory, based on the addresses of the memory cells to be programmed. When the K logical pages are stored in the buffer memory, operations S1520 is performed, and when the K logical pages are not stored in the buffer memory, operation S1530 is performed.

In operation S1520, the memory device 100 reads K logical pages from the buffer memory. The read K logical pages may include no errors or a number of error bits that may be corrected in the memory device 100.

In operation S1530, the memory device 100 reads K logical pages from the memory cell array 110 and transmits the read K logical pages to the memory controller 200. The K logical pages may include a number of error bits that cannot be corrected in the memory device 100.

In operation S1540, the memory device 100 receives corrected K logical pages from the memory controller 200.

In operation S1550, the memory device 100 receives N–K logical pages from the memory controller 200. In an embodiments, operation S1550 is performed when a second delay time elapses after the memory device 100 receives K logical pages from the memory controller 200 in operation S1410 of FIG. 14.

In operation S1560, the memory device 100 performs a program operation on N logical pages based on the N–K logical pages and the K logical pages. The program operation on the N logical pages may be a fine program operation. In an embodiment, operation S1560 is performed when a third delay time elapses after the memory device 100 performs a program operation on K logical pages in operation S1410 of FIG. 14.

While the inventive concept has been particularly shown and described with reference to embodiments thereof, it will be understood that various changes in form and details may be made therein without departing from the spirit and scope of the following claims.

What is claimed is:

1. A method of operating a memory system including a memory device and a memory controller, the method comprising:

programming, by the memory device, K logical pages stored in a page buffer circuit into a memory cell array to set a threshold voltage distribution for the memory cell array;

reading, by the memory device, the K logical pages programmed into the memory cell array into the page buffer circuit after a first delay time elapses;
correcting, by the memory controller, errors in the read K logical pages to generate error-corrected K logical pages;
transmitting, by the memory controller, N−K logical pages to the memory device;
combining the error-corrected K logical pages and the N−K logical pages to generate N logical pages;
programming, by the memory device, the N logical pages into the memory cell array to adjust the threshold voltage distribution,
wherein K is a positive integer and N is a positive integer greater than K.

2. The method of claim 1, further comprising:
transmitting, by the memory device, the read K logical pages to the memory controller based on a comparison result between a number of error bits in the read K logical pages and a reference number; and
transmitting, by the memory controller, the corrected K logical pages to the memory device.

3. The method of claim 2, wherein the transmitting of the read K logical pages to the memory controller comprises detecting a number of error bits in the K logical pages based on parity bits corresponding to partial pages included in each of the K logical pages.

4. The method of claim 1, wherein the programming of the N logical pages into the memory cell array is performed after a second delay time elapses after the programming of the K logical pages into the memory cell array, and comprises:
reading, by the memory device, the K logical pages from the memory cell array in response to a read command received before the first delay time elapses; and
outputting, by the memory device, the error-corrected K logical pages to the memory controller.

5. The method of claim 1, further comprising:
reading, by the memory device, a first logical page among the K logical pages from the memory cell array before the first delay time elapses;
detecting, by the memory device, an error in the read first logical page by comparing the read first logical page with a first logical page stored in the page buffer circuit; and
storing, by the memory device, information, which indicates whether the K logical pages are correctable based on a number of errors, in the buffer memory.

6. The method of claim 5, wherein the reading of the K logical pages into the page buffer circuit comprises:
transmitting, by the memory device, the K logical pages read from the memory cell array to the memory controller based on the information; and
receiving, by the memory device, the error-corrected K logical pages from the memory controller.

7. The method of claim 1, further comprising:
reading, by the memory device, a first logical page among the K logical pages from the memory cell array before the first delay time elapses;
detecting, by the memory device, an error in the read first logical page by comparing the read first logical page with a first logical page stored in the page buffer circuit; and
storing, by the memory device, the K logical pages stored in the page buffer circuit in a buffer memory based on a number of errors.

8. The method of claim 7, wherein the reading of the K logical pages comprises:
reading the K logical pages from the buffer memory when the K logical pages are stored in the buffer memory; and
reading the K logical pages from the memory cell array when the K logical pages are not stored in the buffer memory.

9. A memory system comprising:
a memory device including a memory cell array, a page buffer circuit configured to store data to be stored in the memory cell array or data read from the memory cell array, and an error correction code (ECC) circuit configured to detect an error with respect to the data of the page buffer circuit; and
a memory controller configured to provide, to the memory device, a command instructing performance of a program operation on N bit data, K bit data, and N−K bit data,
wherein the memory device is configured to perform a first program operation on the K bit data in response to the command to set a threshold voltage distribution for the memory cell array, read the K bit data from the memory cell array into the page buffer circuit after a first delay time elapses, provide the read K bit data to the memory controller based on an error in the read K bit data, receive corrected K bit data from the memory controller and store the corrected K bit data in the page buffer circuit, combine the corrected K bit data and the N−K bit data to generate N bit data; and perform a second program operation on the N bit data in the memory cell array, to adjust the threshold voltage distribution,
wherein K is a positive integer and N is a positive integer greater than K.

10. The memory system of claim 9, wherein the memory controller is configured to provide the N−K bit data to the memory device when a second delay time elapses after providing the K bit data to the memory device.

11. The memory system of claim 9, wherein the memory device is configured to perform the second program operation when a third delay time elapses after the first program operation is completed.

12. The memory system of claim 9, wherein the memory device is configured to provide the read K bit data to the memory controller when a number of errors in the read K bit data is greater than a reference number, and correct the errors in the read K bit data through the ECC circuit when the number of errors in the read K bit data is less than the reference number.

13. The memory system of claim 9, wherein the memory controller is configured to provide a read command to the memory device before the first delay time elapses, and the memory device is configured to, in response to the read command, read the K bit data programmed by the first program operation and provide the read K bit data to the memory controller.

14. The memory system of claim 9, wherein the first program operation performs a first fine program operation on the K bit data to determine a threshold voltage distribution for the memory cell array and the second program operation performs a second fine program operation on the N bit data to narrow the threshold voltage distribution based on the corrected K bit data and the N−K bit data.

15. The memory system of claim 9, wherein the memory device is configured to read first bit data of the K bit data, and store, in a buffer memory, information indicating whether the read first bit data is capable of being error-corrected by the, ECC circuit and selectively provide the read K bit data to the memory controller based on the information.

16. The memory system of claim 9, wherein the memory device is configured to read first bit data of the K bit data before the first delay time elapses and store, in a buffer memory, the K bit data and an address of a region in which the K bit data is stored, based on whether the read first bit data is capable of being error-corrected by the, ECC circuit, and selectively read the K bit data from the memory cell array or the buffer memory based on the address, stored in the buffer memory, after the first delay time elapses.

17. A memory device comprising:
a memory cell array including a plurality of memory cells connected to a plurality of bit lines and a plurality of word lines;
a page buffer circuit configured to temporarily store data to be stored in the memory cell array or data read from the memory cell array;
an error code correction (ECC) circuit configured to detect an error in data stored in the page buffer circuit; and
a control logic circuit configured to, in response to a program command for N logical pages, perform a first program operation on the memory cell array based on K logical pages received from a memory controller to set a threshold voltage distribution for the memory cell array, combine K logical pages read from the memory cell array after a delay time elapses and are error-corrected by the ECC circuit and the N−K logical pages received from the memory controller to generate N logical pages, and perform a second program operation on the N logical pages in the memory cell array to adjust the threshold voltage distribution,
wherein K is a positive integer and N is a positive integer greater than K.

18. The memory device of claim 17, wherein, in response to a read command received before the delay time elapses, the K logical pages programmed into the memory cell array are read and transmitted to the memory controller.

19. The memory device of claim 18, wherein the ECC circuit is configured to perform error correction on the read K logical pages before the K logical pages are transmitted to the memory controller.

20. The memory device of claim 17, wherein the first program operation performs a first fine program operation on the K bit data to determine a threshold voltage distribution for the memory cell array and the second program operation performs a second fine program operation on the N bit data to narrow the threshold voltage distribution based on the corrected K bit data and the N−K bit data.

* * * * *